United States Patent
Jeong (10) Patent No.: US 9,478,515 B1
(45) Date of Patent: Oct. 25, 2016

(54) SEMICONDUCTOR PACKAGES INCLUDING INTERCONNECTION MEMBERS

(71) Applicant: SK hynix Inc., Icheon-si Gyeonggi-do (KR)

(72) Inventor: Jung Tae Jeong, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/831,324

(22) Filed: Aug. 20, 2015

(30) Foreign Application Priority Data

Apr. 14, 2015 (KR) ........................ 10-2015-0052729

(51) Int. Cl.
- *H01L 23/16* (2006.01)
- *H01L 21/56* (2006.01)
- *H01L 23/00* (2006.01)
- *H01L 23/10* (2006.01)
- *H01L 23/498* (2006.01)

(52) U.S. Cl.
CPC .............. *H01L 24/49* (2013.01); *H01L 23/10* (2013.01); *H01L 23/4985* (2013.01); *H01L 24/48* (2013.01); *H01L 2224/48092* (2013.01); *H01L 2224/49051* (2013.01); *H01L 2224/49111* (2013.01); *H01L 2924/15798* (2013.01); *H01L 2924/35* (2013.01)

(58) Field of Classification Search
None
See application file for complete search history.

(56) References Cited

U.S. PATENT DOCUMENTS

| | | | | |
|---|---|---|---|---|
| 4,814,943 A * | 3/1989 | Okuaki | .................. | H01L 23/04 174/564 |
| 5,173,766 A * | 12/1992 | Long | ...................... | H01L 21/50 257/668 |
| 5,459,284 A | 10/1995 | Bockelman et al. | | |
| 5,807,768 A * | 9/1998 | Shin | ..................... | H01L 23/3135 257/E23.092 |
| 6,300,687 B1 * | 10/2001 | Bertin | ............... | H01L 23/49524 257/686 |
| 6,545,332 B2 * | 4/2003 | Huang | .............. | H01L 27/14618 257/433 |
| 6,794,760 B1 * | 9/2004 | Jaeck | ....................... | H01L 23/66 257/784 |
| 7,816,750 B2 * | 10/2010 | Chua | ....................... | H01L 24/48 257/433 |
| 7,821,117 B2 * | 10/2010 | Brown | .................. | H01L 21/568 257/668 |
| 8,258,609 B2 * | 9/2012 | Camacho | ............ | H01L 23/3107 257/666 |
| 2006/0097373 A1 * | 5/2006 | Ito | ......................... | H01L 21/563 257/679 |
| 2006/0131067 A1 * | 6/2006 | Byun | .................. | H01L 21/4857 174/260 |
| 2015/0124420 A1 * | 5/2015 | Heinrich | .................. | H05K 1/11 361/767 |

* cited by examiner

*Primary Examiner* — Michael Lebentritt
*Assistant Examiner* — Jordan Klein
(74) *Attorney, Agent, or Firm* — William Park & Associates Ltd.

(57) ABSTRACT

A semiconductor package may include a main substrate, a sub-substrate spaced apart from the main substrate by a gap, and a semiconductor chip disposed on the main substrate. The semiconductor package may include an interconnection member configured to connect the semiconductor chip to the sub-substrate and including twisted wires of a plurality of strands. The semiconductor package may include a main molding member covering the main substrate and the semiconductor chip, and a sub-molding member covering the sub-substrate. The semiconductor package may include a stress buffer layer configured to fill the gap between the main substrate and the sub-substrate, and surround the interconnection member.

20 Claims, 8 Drawing Sheets

SEMICONDUCTOR PACKAGES INCLUDING INTERCONNECTION MEMBERS

CROSS-REFERENCE TO RELATED APPLICATION

The present application claims priority under 35 U.S.C 119(a) to Korean Application No. 10-2015-0052729, filed on Apr. 14, 2015, in the Korean intellectual property Office, which is incorporated herein by reference in its entirety.

BACKGROUND

1. Technical Field

Various embodiments of the present disclosure generally relate to a packaging technology and, more particularly, to semiconductor packages employing interconnection members.

2. Related Art

Portable electronic systems are increasingly in demand because electronic systems are becoming more scaled down and still have high performance. As a result, spaces occupied by semiconductor devices in the electronic systems have been reduced and multi-functional electronic systems have been required. Thus, demands on compact and large capacity semiconductor memory devices have increased. In addition, flexible electronic systems which are capable of bending or warping are increasingly in demand due to the increase in demand for portable and wearable electronic systems.

When semiconductor package are warped or distorted, tensile stress or compressive stress may be applied to interconnection members connecting the semiconductor device (also, referred to as semiconductor chip) to a package substrate. In such cases, the interconnection members may be detached from the connection pads or may be broken. When the interconnection members are detached from the connection pad or broken, the semiconductor package may malfunction or the reliability of the semiconductor package may be degraded. Accordingly, package structures capable of maintaining the electrical connection of the interconnection members have been required even when the semiconductor chip or the substrate is warped or bent.

SUMMARY

According to an embodiment, a semiconductor package may be provided. The semiconductor package may include a main substrate, a sub-substrate spaced apart from a main substrate by a gap, and a semiconductor chip disposed on the main substrate. The semiconductor package may include an interconnection member configured to connect the semiconductor chip to the sub-substrate and including twisted wires of a plurality of strands, and a main molding member covering the main substrate and the semiconductor chip. The semiconductor package may include a sub-molding member covering the sub-substrate, and a stress buffer layer configured to fill the gap between the main substrate and the sub-substrate and surround the interconnection member.

According to an embodiment, a semiconductor package may be provided. The semiconductor package may include a main substrate, a sub-substrate spaced apart from a main substrate by a gap, and a semiconductor chip disposed on the main substrate. The semiconductor package may include an interconnection member configured to connect the semiconductor chip to the sub-substrate and including twisted wires of a plurality of strands. The semiconductor package may include a main molding member covering the main substrate and the semiconductor chip, a sub-molding member covering the sub-substrate. The semiconductor package may include a stress buffer layer configured to expose a sidewall of the main substrate and a sidewall of the sub-substrate and surround the interconnection member.

According to an embodiment, there may be provided a memory card including a semiconductor package. The semiconductor package may include a main substrate, a sub-substrate spaced apart from a main substrate by a gap, and a semiconductor chip disposed on the main substrate. The semiconductor package may include an interconnection member configured to connect the semiconductor chip to the sub-substrate and including twisted wires of a plurality of strands. The semiconductor package may include a main molding member covering the main substrate and the semiconductor chip, a sub-molding member covering the sub-substrate, and a stress buffer layer configured to fill the gap between the main substrate and the sub-substrate, and surround the interconnection member.

According to an embodiment, there may be provided a memory card including a semiconductor package. The semiconductor package may include a main substrate, a sub-substrate spaced apart from a main substrate by a gap, and a semiconductor chip disposed on the main substrate. The semiconductor package may include an interconnection member configured to connect the semiconductor chip to the sub-substrate and including twisted wires of a plurality of strands. The semiconductor package may include a main molding member covering the main substrate and the semiconductor chip, a sub-molding member covering the sub-substrate, and a stress buffer layer configured to expose a sidewall of the main substrate and a sidewall of the sub-substrate, and surround the interconnection member.

According to an embodiment, there may be provided an electronic system including a semiconductor package. The semiconductor package may include a main substrate, a sub-substrate spaced apart from a main substrate by a gap, and a semiconductor chip disposed on the main substrate. The semiconductor package may include an interconnection member configured to connect the semiconductor chip to the sub-substrate and including twisted wires of a plurality of strands. The semiconductor package may include a main molding member covering the main substrate and the semiconductor chip, and a sub-molding member covering the sub-substrate. The semiconductor package may include a stress buffer layer configured to fill the gap between the main substrate and the sub-substrate, and surround the interconnection member.

According to an embodiment, there may be provided an electronic system including a semiconductor package. The semiconductor package may include a main substrate, a sub-substrate spaced apart from a main substrate by a gap, and a semiconductor chip disposed on the main substrate. The semiconductor package may include an interconnection member configured to connect the semiconductor chip to the sub-substrate and including twisted wires of a plurality of strands. The semiconductor package may include a main molding member covering the main substrate and the semiconductor chip, and a sub-molding member covering the sub-substrate. The semiconductor package may include a stress buffer layer configured to expose a sidewall of the main substrate and a sidewall of the sub-substrate, and surround the interconnection member.

According to an embodiment, a semiconductor package may be provided. The semiconductor package may include a main substrate and a sub-substrate spaced apart from the main substrate by a gap. The semiconductor package may include a semiconductor chip disposed on the main substrate, and an interconnection member configured to connect the semiconductor chip to the sub-substrate. The semiconductor package may include a main molding member covering the semiconductor chip, the main substrate, and a portion of the interconnection member. The semiconductor package may include a sub-molding member covering the sub-substrate and another portion of the interconnection member. The semiconductor package may include a stress buffer layer covering a remaining portion of the interconnection member not covered by the main molding member and the sub-molding member.

DETAILED DESCRIPTION

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the present disclosure to those skilled in the art.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Various embodiments may be directed to semiconductor packages employing interconnection members.

Figure 1:
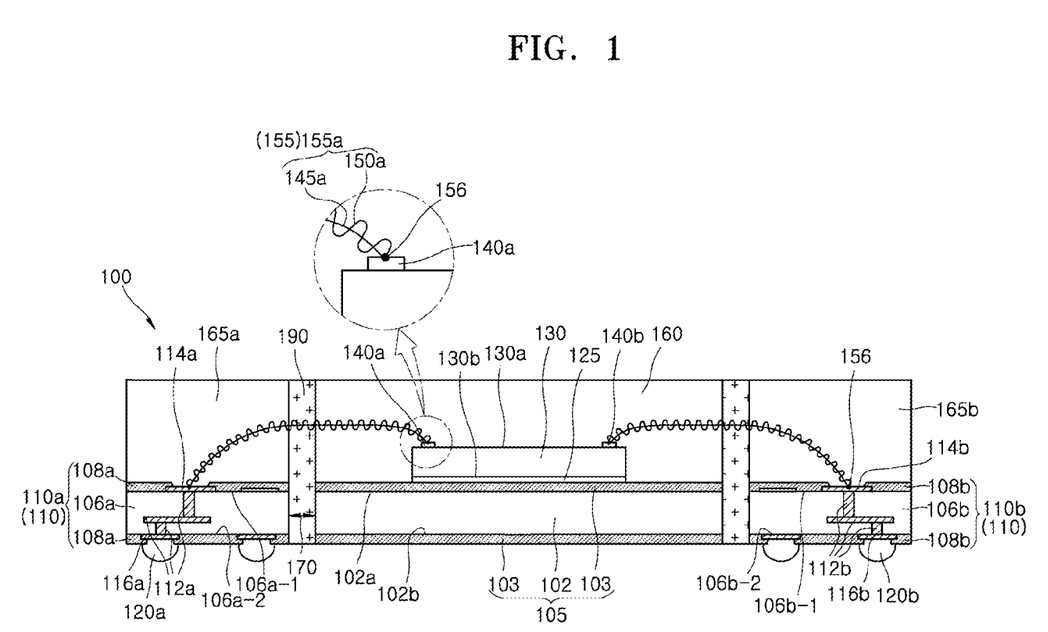
FIG. 1 is a cross-sectional view illustrating a representation of an example of a semiconductor package according to an embodiment.
Figure 2:
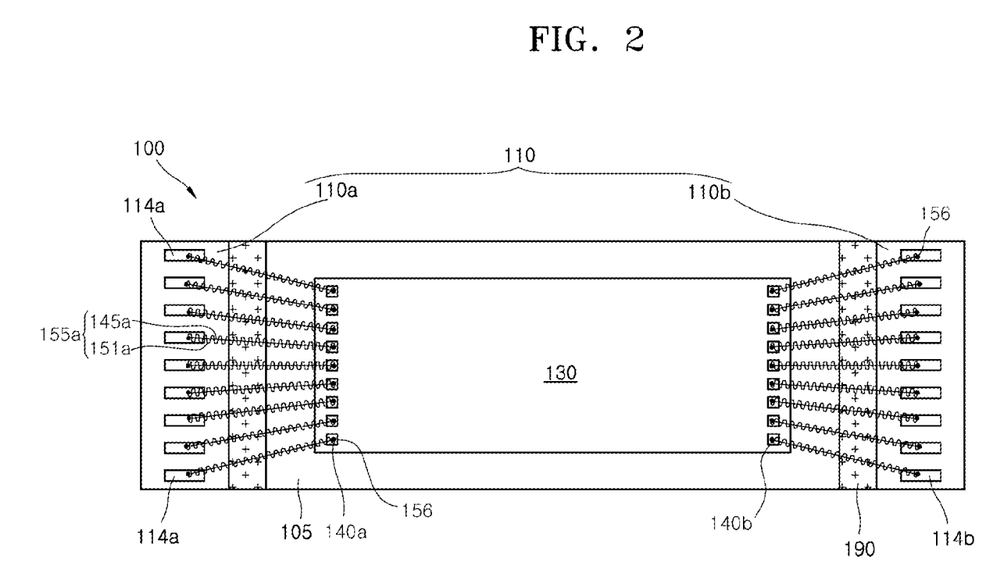
FIG. 2 is a top plan view illustrating a representation of an example of the semiconductor package of FIG. 1.
Figure 3:
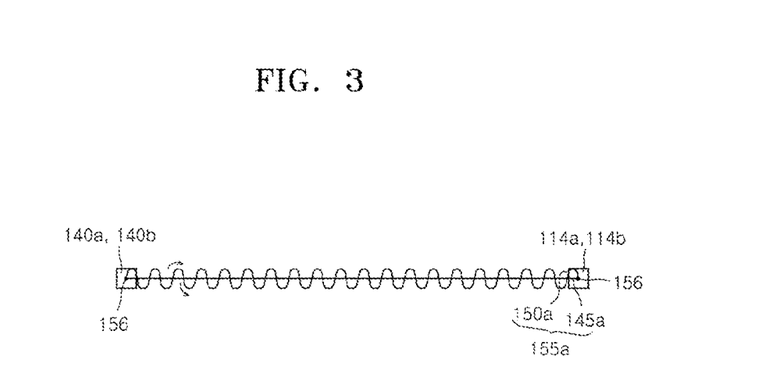
FIGS. 3 and 4 are schematic views illustrating a representation of an example of interconnection members employed in a semiconductor package according to an embodiment.
Figure 4:
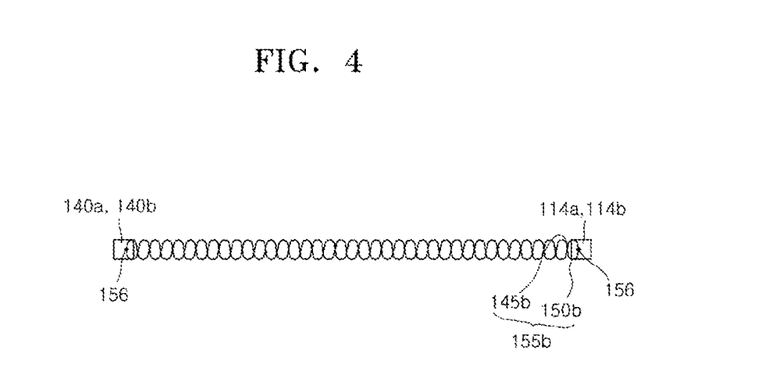
Figure 5:
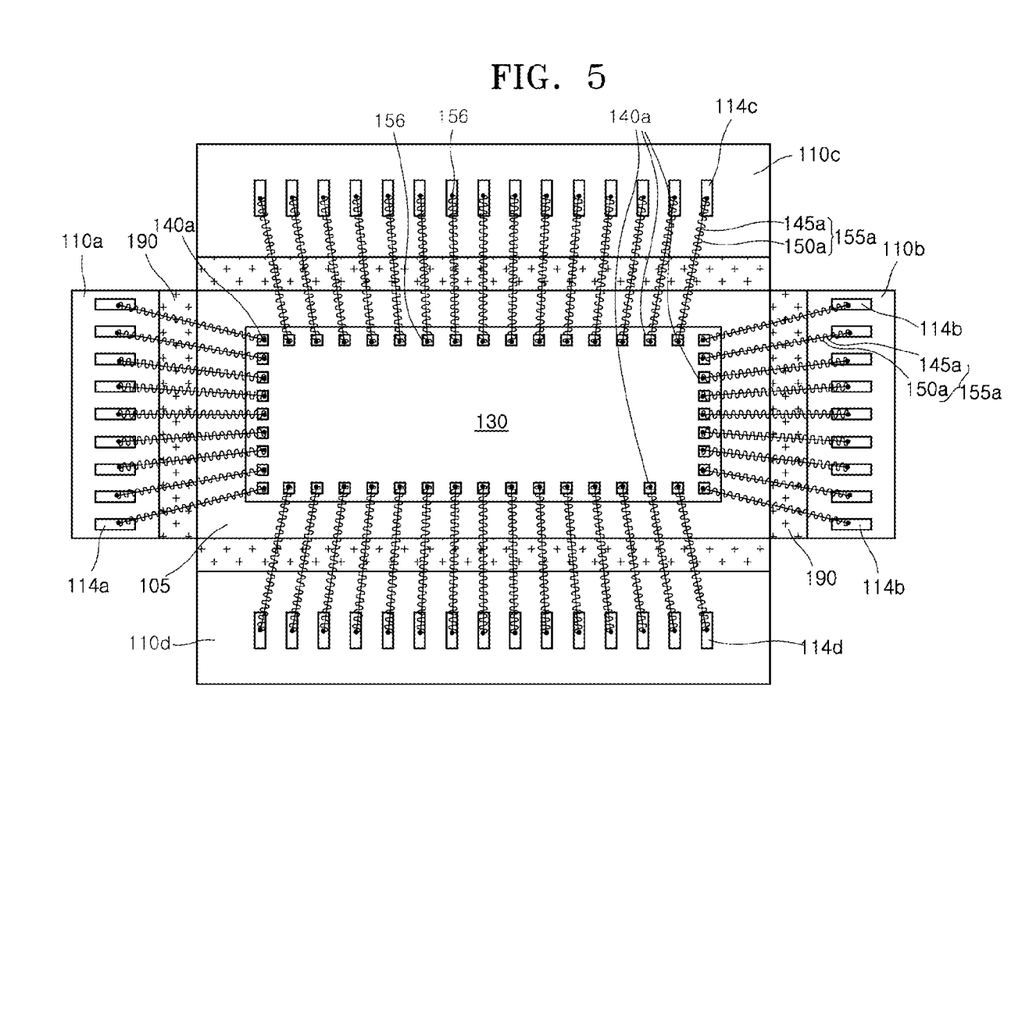
FIG. 5 is a top plan view illustrating a representation of an example of a semiconductor package according to an embodiment.
Figure 6:
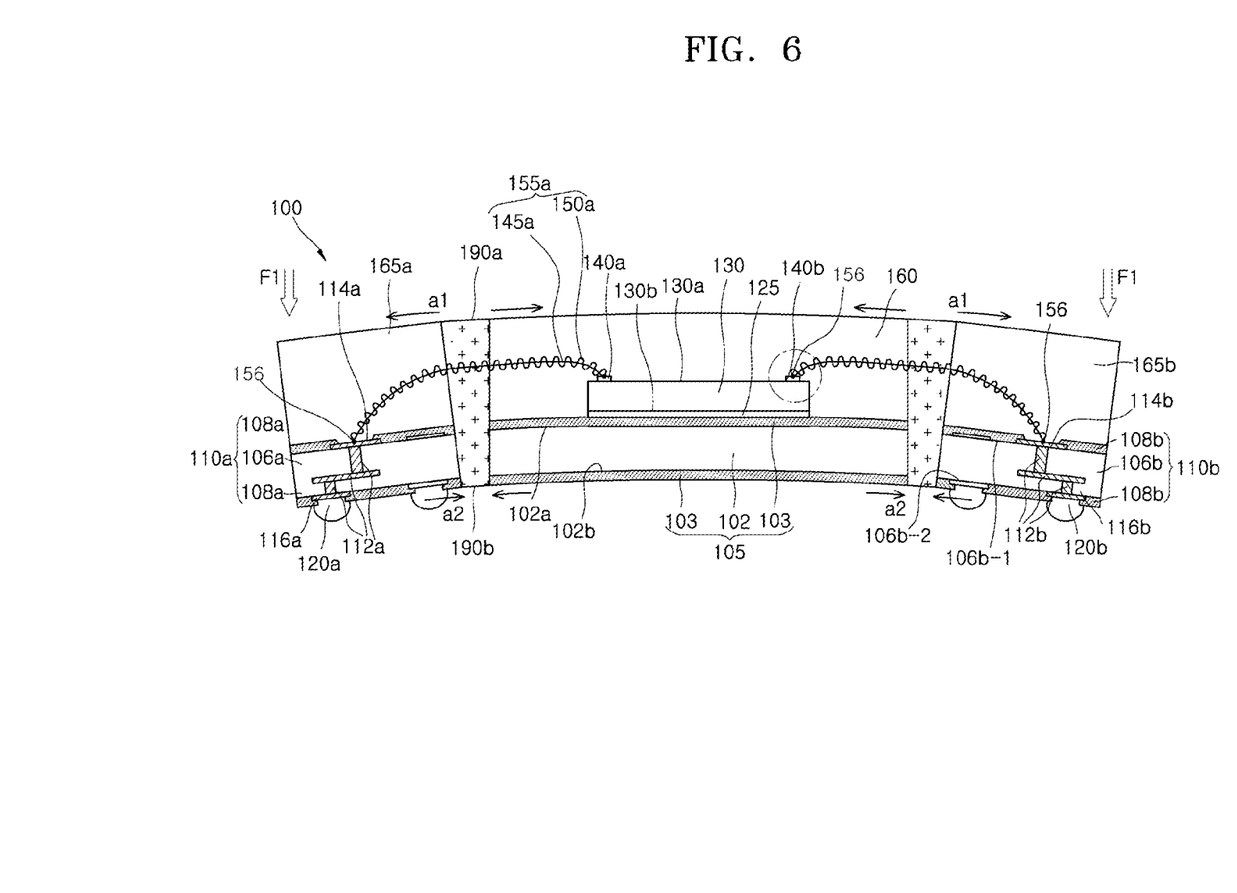
FIG. 6 is a cross-sectional view illustrating a representation of an example of a stress relief action of a semiconductor package according to an embodiment.

FIG. 1 is a cross-sectional view illustrating a representation of an example of a semiconductor package 100 according to an embodiment. FIG. 2 is a top plan view illustrating a representation of an example of the semiconductor package 100 of FIG. 1. FIGS. 3 and 4 are schematic views illustrating a representation of an example of interconnection members employed in the semiconductor package 100 according to an embodiment. FIG. 5 is a cross-sectional view illustrating a representation of an example of a semiconductor package according to an embodiment. FIG. 6 is a schematic view illustrating a representation of an example of a stress relief action of the semiconductor package 100 according to an embodiment.

Referring to FIGS. 1 to 4, the semiconductor package 100 may include a main substrate 105, sub-substrates 110, and a semiconductor chip 130. The semiconductor package 100 may include interconnection members 155 (155a and 155b), a main molding member 160, sub-molding members 165a and 165b, and a stress buffer layer 190.

The main substrate 105 may include a main body 102. The main body 102 may include a front-side portion 102a on which the semiconductor chip 130 is disposed and a back-side portion 102b opposite to the front-side portion 102a. A main insulating pattern 103 may be disposed on each of the front-side portion 102a and the back-side portion 102b of the main body 102. The main insulating pattern 103 may include a solder resist material.

The main substrate 105 may include a printed circuit board (PCB), an organic substrate, or an insulation substrate. If the main substrate 105 is a PCB, the main substrate 105 may be a rigid type PCB or a flexible type PCB. If the main substrate 105 is an insulation substrate, the main substrate 105 may include an insulation material. In an embodiment, the insulation material may include ceramic. If the main substrate 105 is an organic substrate, the main substrate 105 may include an organic material. In an embodiment, the organic material may include epoxy resin.

The sub-substrates 110 may be disposed around the main substrate 105. The sub-substrates 110 may include at least two sub-substrates and may be disposed to be spaced apart from the main substrate 105 by a predetermined distance. For example, the sub-substrates 110 and the main substrate 105 may be disposed to be spaced apart from each other by a gap 170. In an embodiment, as illustrated in FIG. 2, the sub-substrates 110 may include a first sub-substrate 110a and a second sub-substrate 110b that are disposed to be spaced apart from both sides of the main substrate 105.

The first sub-substrate 110a disposed at one side of the main substrate 105 may include a first sub-body 106a and first sub-insulating patterns 108a. The first sub-body 106a may include a front-side portion 106a-1 and a back-side portion 106a-2 that are opposite to each other. First substrate pads 114a may be disposed on the front-side portion 106a-1 of the first sub-body 106a. First ball lands 116a may be disposed on the back-side portion 106a-2 of the first sub-body 106a. First connecting terminals 120a may be attached to the first ball lands 116a, respectively. The first substrate pads 114a may be disposed to be spaced apart from each other on the central portion of the first sub-body 106a, but the present disclosure is not limited thereto. A first wiring pattern 112a electrically connecting the first substrate pad 114a to the first ball land 116a may be disposed to penetrate the first sub-body 106a. The first wiring pattern 112a may be disposed to have a multi-layered structure.

The first sub-insulation patterns 108a may be disposed on the front-side portion 106a-1 and the back-side portion 106a-2 of the first sub-body 106a, respectively. The first sub-insulation pattern 108a disposed on the front-side portion 106a-1 may selectively expose the first substrate pads 114a. The first sub-insulation pattern 108a disposed on the back-side portion 106a-2 may selectively expose the first ball lands 116a. The first sub-insulation patterns 108a may include a solder resist material.

The second sub-substrate 110b disposed at a side of the main substrate 105 opposite to the first sub-substrate 110a may include a second sub-body 106b and second sub-insulating patterns 108b. The second sub-body 106b may include a front-side portion 106b-1 and a back-side portion 106b-2 that are opposite to each other. Second substrate pads 114b may be disposed on the front-side portion 106b-1 of the second sub-body 106b. Second ball lands 116b may be disposed on the back-side portion 106b-2 of the second sub-body 106b. Second connection terminals 120b may be attached to the second ball lands 116b, respectively. The second substrate pads 114b may be disposed to be spaced apart from each other on the central portion of the second sub-substrate 110b, but the present disclosure is not limited thereto. A second wiring pattern 112b electrically connecting the second substrate pad 114b to the second ball land 116b may be disposed to penetrate the second sub-body 106b. The second wiring pattern 112b may be disposed to have a multi-layered structure.

The second sub-insulation patterns 108b may be disposed on the front-side portion 106b-1 and the back-side portion 106b-2 of the second sub-body 106b, respectively. The second sub-insulation pattern 108b disposed on the front-side portion 106b-1 may selectively expose the second substrate pad 114b. The second sub-insulation pattern 108b disposed on the back-side portion 106b-2 of the second sub-body 106b may selectively expose the second ball lands 116b. The second sub-insulation patterns 108b disposed on the second sub-body 106b may include a solder resist material. Each of the first and second sub-substrates 110a and 110b may include the same material as the main substrate 105. For example, each of the first and second sub-substrates 110a and 110b may comprise a PCB, an organic substrate or an insulation substrate.

The semiconductor chip 130 may be disposed on the front-side portion 102a of the main substrate 105. The semiconductor chip 130 may be bonded to the main substrate 105 using an adhesive member 125. The adhesive member 125 may be composed of an adhesive or an adhesive tape, for example, a die attach film (DAF).

The semiconductor chip 130 may include a first surface 130a and a second surface 130b that are opposite to each other. The semiconductor chip 130 may be disposed so that an active surface of the semiconductor chip 130 is located at an opposite side to the main substrate 105. Accordingly, the first surface 130a of the semiconductor chip 130 may be defined as a surface of a front-side portion in which active regions exists and the second surface 130b may be defined as a surface of a back-side portion opposite to the front-side portion. Although not illustrated in the drawings, circuit elements or circuit patterns may be disposed on the first surface 130a of the semiconductor chip 130. The circuit elements may include transistors, each of which has a gate electrode and source/drain regions, and the circuit patterns may include bit lines.

The semiconductor chip 130 may include a plurality of connection pads 140a and 140b. Although FIGS. 1 and 2 illustrate an example in which the connection pads 140a and 140b are disposed on both edges of the semiconductor chip 130, the present disclosure is not limited thereto. For example, in some embodiments, the connection pads 140a and 140b may be disposed on a central portion of the semiconductor chip 130. The connection pads 140a and 140b may comprise aluminum (Al) or copper (Cu).

Referring again to FIGS. 1 and 2, the semiconductor chip 130 may be electrically connected to the first sub-substrate 110a and the second sub-substrate 110b through the interconnection members 155. Each of the interconnection members 155, as illustrated in FIG. 2, may connect one of the plurality of the connection pads 140a and 140b of the semiconductor chip 130 to one of the first substrate pads 114a and the second substrate pads 114b disposed on the first sub-substrate 110a and the second sub-substrate 110b.

The interconnection member 155 may be a first interconnection member 155a illustrated in FIGS. 1 to 3 or a second interconnection member 155b illustrated in FIG. 4. Each of the interconnection members 155 may include a plurality of strands. The strands may be twisted together. For example, if the first interconnection member 155a of FIG. 3 is employed as the interconnection member 155, one of the first interconnection members 155a may include a core wire portion 145a and a twisted wire portion 150a extending from one of the connection pads 140a of the semiconductor chip 130 to one of the first substrate pads 114a on the first sub-substrate 110a. Similarly, another one of the first interconnection members 155a may include a core wire portion 145a and a twisted wire portion 150a extending from one of the connection pads 140b of the semiconductor chip 130 to one of the second substrate pads 114b on the second sub-substrate 110b. The twisted wire portion 150a may extend along a longitudinal direction of the core wire portion 145a and may wind around the core wire portion 145a to have a spiral shape. Each of the core wire portion 145a and the twisted wire portion 150a of the first interconnection member 155a may be in contact with the connection pad 140a (or 140b) and the first or second substrate pad 114a (or 114b) through contact points 156. The core wire portion 145a and the twisted wire portion 150a of the first interconnection member 155a may transmit an electrical signal from the semiconductor chip 130 to any one of the first and second sub-substrates 110a and 110b.

In an embodiment, the semiconductor chip 130 and the first and/or second sub-substrates 110a and/or 110b may be electrically connected to each other through the second interconnection member 155b illustrated in FIG. 4. Referring to FIGS. 2 and 4, the second interconnection member 155b may include a first wire portion 145b and a second wire portion 150b extending from one of the connection pads 140a of the semiconductor chip 130 to one of the first substrate pads 114a. Similarly, the second interconnection member 155b may be disposed to extend from one of the connection pads 140b of the semiconductor chip 130 to one of the second substrate pads 114b. The first wire portion 145b and the second wire portion 150b of the second interconnection member 155b may be twisted with each other to form or include spiral shapes. Each of the first and second wire portions 145b and 150b of the second interconnection member 155b may be in contact with the connection pad 140a (or 140b) and the first or second substrate pad 114a (or 114b) through contact points 156. The first and second wire portions 145b and 150b of the second interconnection member 155b may transmit an electrical signal from the semiconductor chip 130 to any one of the first and second sub-substrates 110a and 110b. Each of the first and second interconnection members 155a and 155b may include gold (Au), silver (Ag) or copper (Cu).

Each of the first and second interconnection members 155a and 155b may include a plurality of strands, for example, a plurality of wires that are twisted. Each of the first and second interconnection members 155a and 155b may have a relatively higher tensile strength than an interconnection member made of a single strand. Evan if the semiconductor package 100 is deformed by an external force, that is, even if the gaps 170 between the main substrate 105 and the sub-substrates 110a and 110b become widened or deformed, the first or second interconnection members 155a or 155b may not be detached from the connection pads 140a and 140b or the substrate pads 114a and 114b or may not be broken because of the high tensile strength of the first or second interconnection members 155a or 155b.

The main molding member 160 may be disposed over the front-side portion 102a of the main substrate 105 to cover the semiconductor chip 130. The first sub-molding member 165a may be disposed over the front-side portion 106a-1 of the first sub-substrate 110a. The second sub-molding member 165b may be disposed over the front-side portion 106b-1 of the second sub-substrate 110b. Each of the main molding member 160, the first sub-molding member 165a, and the second sub-molding member 165b may include epoxy molding compound (EMC), hardener, organic filler or inorganic filler. The main molding member 160, the first sub-molding member 165a, and the second sub-molding member 165b may physically and chemically protect the semiconductor chip 130, the main substrate 105, the first sub-substrate 110a, and the second sub-substrate 110b from the external environment. Sidewalls of the main molding member 160 may be vertically aligned with sidewalls of the main substrate 105. Sidewalls of the first sub-molding member 165a may be vertically aligned with sidewalls of the first sub-substrate 110a, and sidewalls of the second sub-molding member 165b may be vertically aligned with sidewalls of the second sub-substrate 110b. The main molding member 160 and the first sub-molding member 165a may be disposed to be spaced apart from each other by a predetermined distance, and the main molding member 160 and the second sub-molding member 165b may also be disposed to be spaced apart from each other by a predetermined distance.

Referring again to FIGS. 1 and 2, the stress buffer layer 190 may be disposed between the main substrate 105 and the first and second sub-substrates 110a and 110b. The stress buffer layer 190 may fill the gaps 170 between the main substrate 105 and the sub-substrates 110a and 110b. The stress buffer layers 190 may extend to further fill the gaps between the main molding member 160 and the first and second sub-molding members 165a and 165b. The stress buffer layer 190 may include a flexible material, for example, an insulation material having a tensile modulus of elasticity (Young's modulus) which is lower than a tensile modulus of elasticity of the main molding member 160 and the sub-molding members 165a and 165b. For example, the main molding member 160 and the sub-molding members 165a and 165b may include epoxy molding compound (EMC), and the EMC has a Young's modulus of about 20 GPa to about 30 GPa. In contrast, the stress buffer layer 190 may include a material having a Young's modulus of about 0.01 GPa to about 0.1 GPa which is relatively lower than that of the EMC. In an embodiment, the stress buffer layer 190 may include silicone resin, silicone rubber, or polymer.

If the first interconnection members 155a are employed as the interconnection members 155, a portion of each of the first interconnection members 155a may be covered with the main molding member 160 and another portion of each of the first interconnection members 155a may be covered with the first sub-molding member 165a or the second sub-molding member 165b.

The remaining portion, which is not covered with the main molding member 160 and the first and second sub-molding members 165a and 165b may be covered with the stress buffer layer 190.

The stress buffer layer 190 may alleviate a tensile stress or a compressive stress locally concentrated on the substrates 105, 110a and 110b when an external force is applied to the semiconductor package 100 and the semiconductor package 100 is bent or warped. As illustrated in FIG. 6, if an external force F1 is applied to the semiconductor package 100, the semiconductor package 100 may warp. For example, a top surface 190a of the stress buffer layer 190 may expand in both side directions as indicated by first arrows a1, and a lower surface 190b of the stress buffer layer 190 may be compressed as indicated by second arrows a2. The warpage phenomenon of the semiconductor package 100 may occur due to movement of the first sub-substrate 110a and the second sub-substrate 110b with deformation of the stress buffer layer 190. In such an example, the tensile stress and the compressive stress substantially applied to the main substrate 105 and the first and second sub-substrates 110a and 110b may be dispersed or relieved by stress buffer layer 190. Accordingly, the semiconductor package 100 may be bent without any damage of the main substrate 105 and the semiconductor chip 130 disposed on the main substrate.

Furthermore, as described above, each of the first and second interconnection members 155a and 155b may include a plurality wires, that is, a plurality of strands that are twisted together. Thus, each of the first and second interconnection members 155a may have a relatively higher tensile strength than an interconnection member made of a single strand. Accordingly, as illustrated in FIG. 6, even if the gaps 170 between the main substrate 105 and the sub-substrates 110a and 110b become widen or deformed, the first or second interconnection members 155a or 155b may not be detached from the connection pads 140a and 140b or the substrate pads 114a and 114b or may not be broken. Accordingly, it may be possible to realize a flexible package capable of stably maintaining the electrical connection with the interconnection members even if the flexible package warps.

Although FIG. 2 illustrates an example in which the first and second sub-substrates 110a and 110b are disposed to be adjacent to both opposite sides of the main substrate 105, the present disclosure is not limited thereto. For example, as illustrated in FIG. 5, a first sub-substrate 110a, a second sub-substrate 110b, a third sub-substrate 110c and a fourth sub-substrate 110d may be disposed to be spaced apart from four sides of the main substrate 105. The first sub-substrate 110a and the second sub-substrate 110b illustrated in FIG. 5 may have substantially the same configurations as the first sub-substrate 110a and the second sub-substrate 110b illustrated in FIG. 2, respectively. Thus, descriptions of the first sub-substrate 110a and the second sub-substrate 110b will be omitted hereinafter. Referring to FIG. 5, the third sub-substrate 110c and the fourth sub-substrate 110d may be disposed to be spaced apart from the remaining two sides of the main substrate 105 by a predetermined distance. Accordingly, the third sub-substrate 110c and the fourth sub-substrate 110d may be separated from the main substrate 105 by a predetermined gap.

Third substrate pads 114c and fourth substrate pads 114d may be disposed on a front-side portion of the third sub-substrate 110c and a front-side portion of the fourth sub-substrate 110d, respectively. Although not illustrated in the drawing, third ball lands and fourth ball lands may be disposed on a back-side portion of the third sub-substrate 110c and a back-side portion of the fourth sub-substrate 110d, respectively. If the third sub-substrate 110c and the fourth sub-substrate 110d are additionally disposed adjacent to the main substrate 105, the plurality of connection pads 140a may be disposed on four edges of the semiconductor chip 130 stacked on the main substrate 105. The connection pads 140a of the semiconductor chip 130 may be connected to the first to fourth substrate pads 114a, 114b, 114c and 114d through the first interconnection members 155a or the second interconnection members 155b described above.

Figure 7:
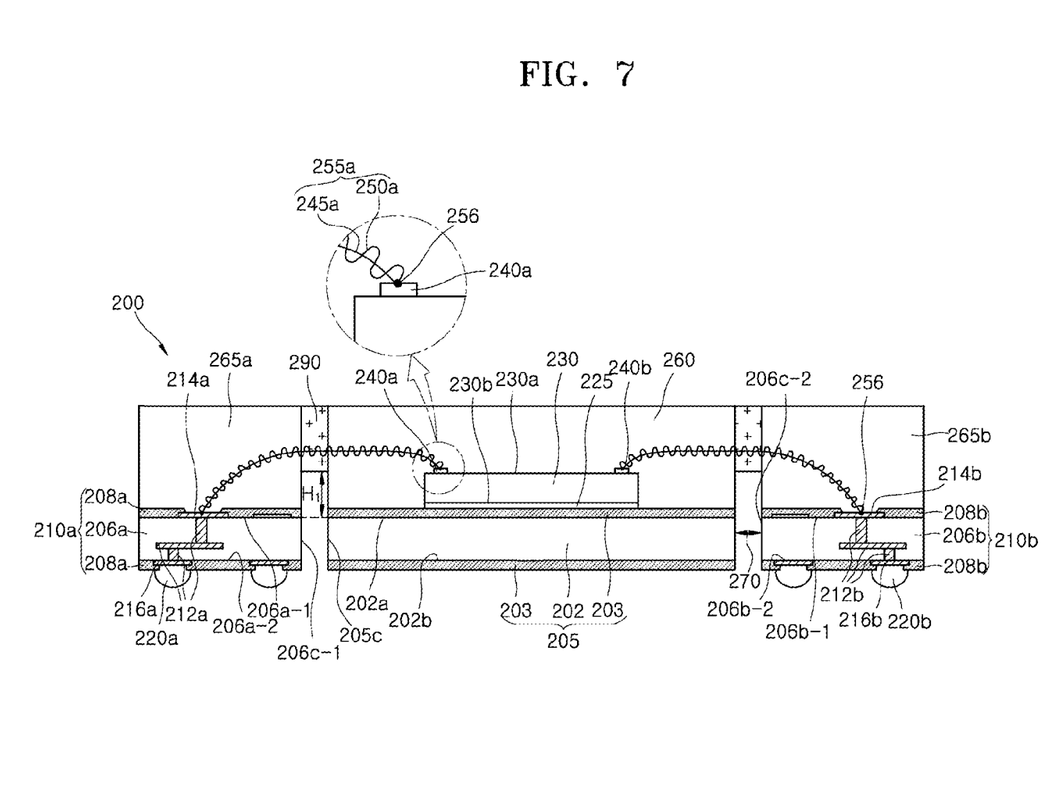
FIG. 7 is a cross-sectional view illustrating a representation of an example of a semiconductor package according to an embodiment.
Figure 8:
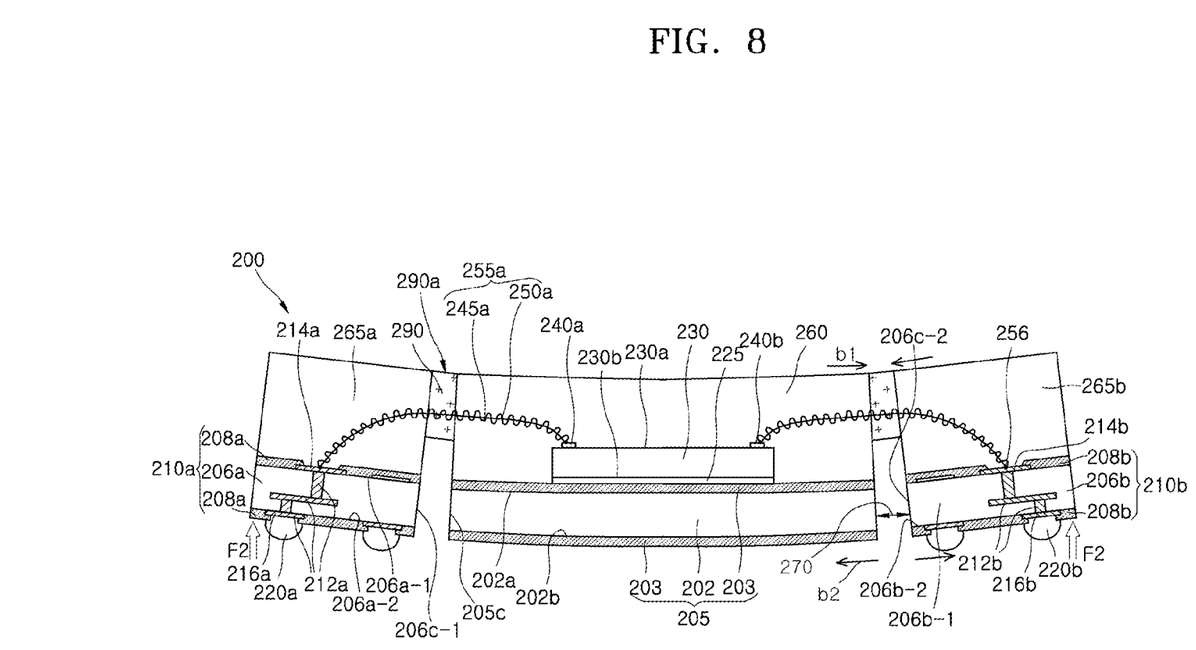
FIG. 8 is a cross-sectional view illustrating a representation of an example of a stress relief action of a semiconductor package according to an embodiment.

FIG. 7 is a cross-sectional view illustrating a representation of an example of a semiconductor package 200 according to an embodiment. FIG. 8 is a cross-sectional view illustrating a representation of an example of a stress relief action of the semiconductor package according to an embodiment.

Referring to FIG. 7, the semiconductor package 200 may include a main substrate 205, sub-substrates 210, and a semiconductor chip 230. The semiconductor package 200 may include interconnection members 255a, a main molding member 260, sub-molding members 265a and 265b, and a stress buffer layer 290.

The main substrate 205 may include a main body 202 and main insulation patterns 203. The main body 202 may include a front-side portion 202a on which the semiconductor chip 230 is disposed and a back-side portion 202b opposite to the front-side portion 202a. The main insulation patterns 203 may be disposed on the front-side portion 202a and the back-side portion 202b of the main body 202, respectively. Each of the main insulation patterns 203 may include a solder resist material. The main substrate 205 may include a printed circuit board (PCB), an organic substrate or an insulation substrate.

The sub-substrates 210 may include a plurality of sub-substrates, for example, a first sub-substrate 210a and a second sub-substrate 210b. The plurality of sub-substrates 210, that is, the first and second sub-substrates 210a and 210b may be disposed around the main substrate 205. The sub-substrates 210a and 210b may be disposed to be spaced apart from the main substrate 205 by a predetermined distance. That is, the sub-substrates 210a and 210b may be spaced apart from the main substrate 205 by a predetermined gap 270. In an embodiment, the first sub-substrate 210a and the second sub-substrate 210b may be disposed to be adjacent to both sides of the main substrate 205, respectively. In an embodiment, the sub-substrates 210 may include four sub-substrates that are disposed to be spaced apart from four sides of the main substrate 205, as illustrated in FIG. 5.

The present embodiments will be described in conjunction with an example in which the first and second sub-substrates 210a and 210b are disposed to be spaced apart from both sides of the main substrate 205. For example, the first sub-substrate 210a disposed at one side of the main substrate 205 may include a first sub-body 206a and first sub-insulation patterns 208a. First substrate pads 214a may be disposed on a front-side portion 206a-1 of the first sub-body 206a, and first ball lands 216a may be disposed on a back-side portion 206a-2 of the first sub-body 206a. First connection terminals 220a may be attached to the first ball lands 216a, respectively. The first substrate pads 214a may be arranged to be spaced apart from each other on the first sub-substrate 210a. First wiring patterns 212a may be disposed inside the first sub-body 206a to electrically connect the first substrate pads 214a to the first ball lands 216a. One of the first sub-insulating patterns 208a may selectively expose the first substrate pads 214a on the front-side portion 206a-1 of the first sub-body 206a. The other of the first sub-insulating patterns 208a may selectively expose the first ball lands 216a on the back-side portion 206a-2. Each of the first sub-insulation patterns 208a may include a solder resist material.

The second sub-substrate 210b disposed at a side of the main substrate 205 opposite to the first sub-substrate 210a may include a second sub-body 206b and second sub-insulation patterns 208b. Second substrate pads 214b may be disposed on a front-side portion 206b-1 of the second sub-body 206b, and second ball lands 216b may be disposed on a back-side portion 206b-2 of the second sub-body 206b opposite to the front-side portion 206b-1. Second connection terminals 220b may be attached to the second ball lands 216b, respectively. The second substrate pads 214b may be arranged to be spaced apart from each other on the second sub-substrate 210b. Second wiring patterns 212b may be disposed inside the second sub-body 206b to electrically connect the second substrate pads 214b to the second ball lands 216b. The second wiring patterns 212b may be disposed to have a multi-layered structure. Each of the first and second sub-substrates 210a and 210b may include the same material as the main substrate 205.

The second sub-insulation pattern 208b disposed on the front-side portion 206b-1 of the second sub-body 206b may selectively expose the second substrate pads 214b. The second sub-insulation pattern 208b disposed on the back-side portion 206b-2 of the second sub-body 206b may selectively expose the second ball lands 216b. The second sub-insulation pattern 208b may include a solder resist material.

The semiconductor chip 230 may be disposed on the front-side portion 202a of the main substrate 205. The semiconductor chip 230 may be bonded to the main substrate 205 using an adhesive member 225. The semiconductor chip 230 may include a plurality of connection pads 240a and 240b disposed on a top surface thereof. Although FIG. 7 illustrates an example in which the connection pads 240a and 240b are disposed on both edges of the semiconductor chip 230, the present disclosure is not limited thereto. For example, although not illustrated in the drawing, the connection pads 240a and 240b may be disposed on a central portion of the semiconductor chip 230. Each of the connection pads 240a and 240b may include aluminum (Al) or copper (Cu).

The semiconductor chip 230 may be electrically connected to the first and second sub-substrates 210a and 210b through the interconnection members 255a. Each interconnection member 255a may have substantially the same configuration as any one of the first and second interconnection members 155a and 155b illustrated in FIG. 3 and FIG. 4. A core wire portion 245a and a twisted wire portion 250a of each of the interconnection members 255a may be connected to each other through contact points 256 at both ends thereof. Accordingly, the core wire portion 245a and the twisted wire portion 250a of each interconnection member 255a may transmit an electrical signal from the semiconductor chip 230 to any one of the first and second sub-substrates 210a and 210b. Each of the interconnection members 255a may include gold (Au), silver (Ag) or copper (Cu).

The main molding member 260 may be disposed on the front-side portion 202a of the main substrate 205 to cover the semiconductor chip 230. The first sub-molding member 265a may be disposed on the front-side portion 206a-1 of the first sub-body 206a. The second sub-molding member 265b may be disposed on the front-side portion 206b-1 of the second sub-body 206b. Each of the main molding member 260, the first sub-molding member 265a and the second sub-molding member 265b may include epoxy molding compound (EMC), hardener, organic filler or inorganic filler. The main molding member 260, the first sub-molding member 265a and the second sub-molding member 265b may physically and chemically protect the semiconductor chip 230, the main substrate 205, the first sub-substrate 210a and the second sub-substrate 210b from the external environment.

Sidewalls of the main molding member 260 may be vertically aligned with sidewalls 205c of the main substrate 205. Sidewalls of the first sub-molding member 265a may be vertically aligned with sidewalls 206c-1 of the first sub-substrate 210a. Sidewalls of the second sub-molding member 265b may be vertically aligned with sidewalls 206c-2 of the second sub-substrate 210b. The first sub-molding member 265a and the second sub-molding member 265b may be disposed to be spaced apart from the main molding member 260 by a predetermined distance.

The stress buffer layer 290 may be disposed between the main molding member 260 and the first sub-molding member 265a as well as between the main molding member 260 and the second sub-molding member 265b. The stress buffer layer 290 may be disposed to be spaced apart from top surfaces of the main substrate 205 and the sub-substrates 210a and 210b by a predetermined height H1. In an embodiment, the stress buffer layer 290 may expose the side walls 205c, 206c-1 and 206c-2 of the main substrate 205 and the sub-substrates 210a and 210b and may surround a portion of each of the interconnection members 255a. The stress buffer layer 290 may also expose a portion of each of both sidewalls of the main molding member 260, a portion of one of sidewalls of the first sub-molding member 265a, and a portion of one of sidewalls of the second sub-molding member 265b. Accordingly, as illustrated in FIG. 7, the predetermined empty gaps 270 may be provided between the main substrate 205 and the first sub-substrate 210a as well as between the main substrate 205 and the second sub-substrate 210b. In an embodiment, although not illustrated in the drawing, the stress buffer layer 290 may cover only exposed surfaces of the interconnection members 255a in a tube form. The stress buffer layer 290 may include a flexible material, for example, an insulation material having a tensile modulus of elasticity (Young's modulus) which is lower than that of epoxy molding compound (EMC). The stress buffer layer 290 of the embodiment may include a material having a tensile modulus of elasticity of about 0.01 GPa to about 0.1 GPa. In an embodiment, the stress buffer layer 290 may include silicone resin, silicone rubber, or polymer.

The stress buffer layer 290 may alleviate a tensile stress or a compressive stress locally concentrated on the substrates 205, 210a and 210b when an external force is applied to the semiconductor package 200 and the semiconductor package 200 is bent or warped. As illustrated in FIG. 8, if an external force F2 is applied to the semiconductor package 200, the semiconductor package 200 may warp. For example, while a top surface 290a of the stress buffer layer 290 may be compressed as indicated by first arrows b1, lower portions of the first and second sub-substrates 210a and 210b may move to expand the empty gaps 270 in both side directions as indicated by second arrows b2. As a result, the semiconductor package 200 may warp to have a smile shape. The empty gaps 270 may provide spaces which are capable of absorbing a tensile stress or a compressive stress applied to the lower portions of the substrates 205, 210a and 210b.

The warpage phenomenon of the semiconductor package 200 may occur due to expansion or shrinkage of the gaps 270 between the substrates 205, 210a and 210b. That is, the tensile stress and the compressive stress substantially applied to the main substrate 205 and the first and second sub-substrates 210a and 210b may be dispersed or relieved by the gaps 270. Accordingly, the semiconductor package 200 may be bent without any damage of the main substrate 205 and the semiconductor chip 230 disposed on the main substrate 205. Furthermore, as described above, each of the interconnection members 255a may include a plurality wires, that is, a plurality of strands that are twisted together. Thus, each of the interconnection members 255a may have a relatively higher tensile strength than an interconnection member made of a single strand. Accordingly, as illustrated in FIG. 8, even if the empty gaps 270 between the main substrate 205 and the sub-substrates 210a and 210b become deformed, the interconnection members 255a may not be detached from the connection pads 240a and 240b or the substrate pads 214a and 214b or may not be broken. As a result, it may be possible to realize a flexible package capable of stably maintaining the electrical connection with the interconnection members even if the flexible package warps.

Figure 9:
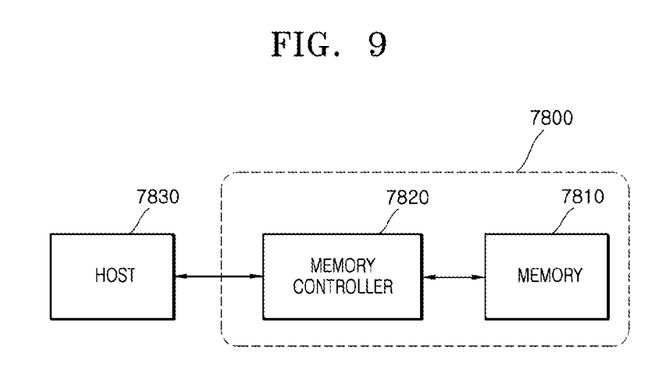
FIG. 9 is a block diagram illustrating a representation of an example of an electronic system employing a memory card including at least one of semiconductor packages in accordance with various embodiments.

The semiconductor package described above may be applied to various electronic systems. FIG. 9 is a block diagram illustrating a representation of an example of an electronic system including a memory card 7800 including at least one semiconductor package according to an embodiment.

Referring to FIG. 9, the memory card 7800 includes a memory 7810, such as a nonvolatile memory device, and a memory controller 7820. The memory 7810 and the memory controller 7820 may store data or read stored data. The memory 7810 and/or the memory controller 7820 include one or more semiconductor chips disposed in an embedded package according to an embodiment. The memory 7810 may include a nonvolatile memory device to which the technology of the embodiments of the present application is applied. The memory controller 7820 may control the memory 7810 such that stored data is read out or data is stored in response to a read/write request from a host 7830.

Figure 10:
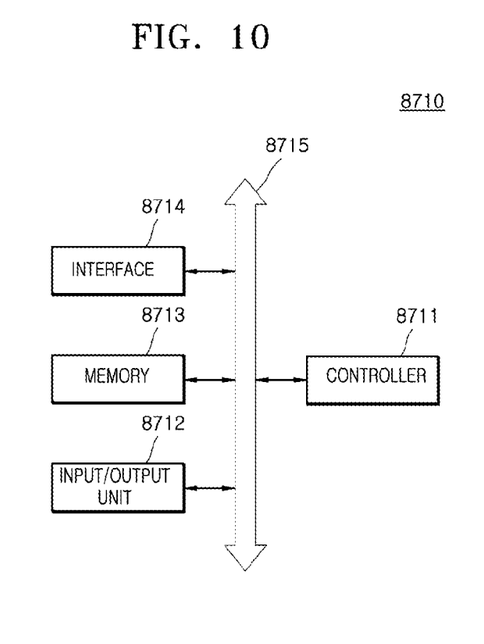
FIG. 10 is a block diagram illustrating a representation of an example of an electronic system including at least one of semiconductor packages in accordance with various embodiments.

FIG. 10 is a block diagram illustrating a representation of an example of an electronic system 8710 including at least one package according to an embodiment. The electronic system 8710 may include a controller 8711, an input/output unit 8712, and a memory 8713. The controller 8711, the input/output unit 8712 and the memory 8713 may be coupled with one another through a bus 8715 providing a path through which data may move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this example, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
   a main substrate;
   a sub-substrate spaced apart from the main substrate by a gap;
   a semiconductor chip disposed on the main substrate;
   an interconnection member including twisted wires of a plurality of strands and connecting the semiconductor chip to the sub-substrate;
   a main molding member covering the semiconductor chip and the main substrate;
   a sub-molding member covering the sub-substrate; and
   a stress buffer layer disposed between the main molding member and the sub-molding member, filling the gap between the main substrate and the sub-substrate, and surrounding a portion of the interconnection member, wherein a top surface of the stress buffer layer, a top surface of the main molding member and a top surface of the sub-molding member being coplanar.

2. The semiconductor package of claim 1, wherein the main substrate includes one selected from the group consisting of a printed circuit board (PCB), an organic substrate and an insulation substrate.

3. The semiconductor package of claim 1, wherein the sub-substrate includes one selected from the group consisting of a printed circuit board (PCB), an organic substrate and an insulation substrate.

4. The semiconductor package of claim 1, wherein the sub-substrate includes:
   a sub-body having a front-side portion and a back-side portion that are opposite to each other;
   a substrate pad disposed on the front-side portion of the sub-body;
   a ball land disposed on the back-side portion of the sub-body;
   a connection terminal attached to the ball land; and
   a wiring pattern penetrating the sub-body to electrically connect the substrate pad to the ball land.

5. The semiconductor package of claim 1,
   wherein the sub-substrate includes a first sub-substrate and a second sub-substrate; and
   wherein the first sub-substrate and the second sub-substrate are disposed to be spaced apart from both sides of the main substrate, respectively.

6. The semiconductor package of claim 1,
   wherein the sub-substrate includes first to fourth sub-substrates; and
   wherein the first to fourth sub-substrates are disposed to be spaced apart from four sides of the main substrate, respectively.

7. The semiconductor package of claim 1, wherein the interconnection member includes:
   a core wire portion configured to extend from a connection pad of the semiconductor chip to a substrate pad of the sub-substrate, and
   a twisted wire portion configured to extend along a length direction of the core wire portion,
   wherein the twisted wire portion is twisted and wound around the core wire portion.

8. The semiconductor package of claim 7, wherein the twisted wire portion is wound around the core wire portion to have a spiral shape.

9. The semiconductor package of claim 7,
   wherein one end of the core wire portion and one end of the twisted wire portion are connected to each other at one contact point of the connection pad of the semiconductor chip;
   wherein the other end of the core wire portion and the other end of the twisted wire portion are connected to each other at one contact point of the substrate pad of the sub-substrate; and
   wherein the core wire portion and the twisted wire portion transmit an electrical signal from the connection pad of the semiconductor chip to the substrate pad of the sub-substrate.

10. The semiconductor package of claim 1,
    wherein the interconnection member includes a first wire portion and a second wire portion that extend from a connection pad of the semiconductor chip to a substrate pad of the sub-substrate; and
    wherein the first wire portion and the second wire portion are twisted each other to have spiral shapes.

11. The semiconductor package of claim 10, wherein the connection pad is disposed on an edge of the semiconductor chip.

12. The semiconductor package of claim 10, wherein the connection pad is disposed on a central portion of the semiconductor chip.

13. The semiconductor package of claim 1, wherein the interconnection member includes one selected from the group consisting of gold (Au), silver (Ag) and copper (Cu).

14. The semiconductor package of claim 1, wherein at least one of the main molding member and the sub molding member includes one selected from the group consisting of epoxy molding compound (EMC), hardener, organic filler, and inorganic filler.

15. The semiconductor package of claim 1, wherein the stress buffer layer includes an insulation material having a tensile modulus of elasticity (Young's modulus) which is lower than a tensile modulus of elasticity of the main molding member and the sub-molding member.

16. The semiconductor package of claim 15, wherein the stress buffer layer includes an insulation material having a tensile modulus of elasticity (Young's modulus) of about 0.01 GPa to about 0.1 GPa.

17. The semiconductor package of claim 16, wherein the insulation material includes one of silicone resin, silicone rubber and polymer.

18. The semiconductor package of claim 15, wherein the main molding member and the sub-molding member have a tensile modulus of elasticity (Young's modulus) of about 20 GPa to about 30 GPa.

19. A semiconductor package comprising:
a main substrate;
a sub-substrate spaced apart from the main substrate by a gap;
a semiconductor chip disposed on the main substrate;
an interconnection member connecting the semiconductor chip to the sub-substrate and including twisted wires of a plurality of strands;
a main molding member covering the main substrate and the semiconductor chip;
a sub-molding member covering the sub-substrate; and
a stress buffer layer disposed between the main molding member and the sub-molding member, exposing a sidewall of the main substrate, a sidewall of the sub-substrate, a portion of sidewall of the main molding member and a portion of sidewall of the sub-molding member,
wherein the stress buffer layer covers a remaining portion of the interconnection member not covered by the main molding member and the sub-molding member.

20. A semiconductor package comprising:
a main substrate;
a sub-substrate spaced apart from the main substrate by a gap;
a semiconductor chip disposed on the main substrate;
an interconnection member configured to connect the semiconductor chip to the sub-substrate;
a main molding member covering the semiconductor chip, the main substrate, and a portion of the interconnection member;
a sub-molding member covering the sub-substrate and another portion of the interconnection member; and
a stress buffer layer covering a remaining portion of the interconnection member not covered by the main molding member and the sub-molding member, wherein a top surface of the stress buffer layer, a top surface of the main molding member and a top surface of the sub-molding member being coplanar.

* * * * *